United States Patent
Ju (10) Patent No.: US 10,872,288 B2
(45) Date of Patent: Dec. 22, 2020

(54) CHARGED PARTICLE COUNTING DEVICE, MANUFACTURING METHOD THEREOF, AND CHARGED PARTICLE COUNTING SYSTEM

(71) Applicant: BOE Technology Group Co., Ltd., Beijing (CN)

(72) Inventor: Changcheng Ju, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 169 days.

(21) Appl. No.: 16/093,266

(22) PCT Filed: Apr. 20, 2018

(86) PCT No.: PCT/CN2018/083828
§ 371 (c)(1),
(2) Date: Oct. 12, 2018

(87) PCT Pub. No.: WO2018/219063
PCT Pub. Date: Dec. 6, 2018

(65) Prior Publication Data
US 2019/0171924 A1    Jun. 6, 2019

(30) Foreign Application Priority Data
May 31, 2017    (CN) .......................... 2017 1 0399348

(51) Int. Cl.
*G06M 1/10*      (2006.01)
*H01L 49/02*    (2006.01)
(Continued)

(52) U.S. Cl.
CPC ........ *G06M 1/102* (2013.01); *G01N 15/0656* (2013.01); *G01T 1/00* (2013.01);
(Continued)

(58) Field of Classification Search
CPC .... G06M 1/102; H01L 28/10; H01L 51/0545; H01L 51/107; H01L 51/105; H01L 51/0048; H01F 38/14
(Continued)

(56) References Cited

U.S. PATENT DOCUMENTS 4,016,516 A * 4/1977 Sauter ....................... H01P 1/22
                                                          333/81 R
4,502,028 A * 2/1985 Leake ....................... H01P 5/04
                                                          324/601
(Continued)

FOREIGN PATENT DOCUMENTS

CN    102132153 A    7/2011
CN    102150037 A    8/2011
(Continued)

OTHER PUBLICATIONS

International Search Report dated Jun. 28, 2018 from PCT/CN218/083828.

*Primary Examiner* — Giovanni Astacio-Oquendo
(74) *Attorney, Agent, or Firm* — Fay Sharpe LLP (57) ABSTRACT

A charged particle counting device, a manufacturing method thereof, and a charged particle counting system are provided. The charged particle counting device includes: a bipolar transistor (10) and a magneto-electric induction coil (20), a gate (101) of the bipolar transistor is electrically connected to an end of the magneto-electric induction coil, and the other end of the magneto-electric induction coil is applied with a constant voltage, when a stream of positively charged particles passes through the magneto-electric induction coil and a first induced voltage generated by the magneto-electric induction coil is greater than a predetermined voltage threshold, a channel of the bipolar transistor is an N-type channel; and when a stream of negatively charged particles passes through the magneto-electric induc-
(Continued)

tion coil and a second induced voltage generated by the magneto-electric induction coil is less than the predetermined voltage threshold, the channel of the bipolar transistor is a P-type channel.

20 Claims, 3 Drawing Sheets

(51) Int. Cl.
| | |
|---|---|
| H01L 51/10 | (2006.01) |
| H01F 38/14 | (2006.01) |
| H01L 27/30 | (2006.01) |
| G01N 15/06 | (2006.01) |
| G01T 1/00 | (2006.01) |
| H01J 37/244 | (2006.01) |
| H01L 51/05 | (2006.01) |
| H01L 51/00 | (2006.01) |
| G01N 15/00 | (2006.01) |

(52) U.S. Cl.
CPC ............ *H01F 38/14* (2013.01); *H01J 37/244* (2013.01); *H01L 27/305* (2013.01); *H01L 28/10* (2013.01); *H01L 51/105* (2013.01); *H01L 51/107* (2013.01); *G01N 2015/0053* (2013.01); *G01N 2015/0687* (2013.01); *H01L 51/0048* (2013.01); *H01L 51/0545* (2013.01); *H01L 2251/308* (2013.01)

(58) Field of Classification Search
USPC .......................................... 324/239, 228, 200
See application file for complete search history.

(56) References Cited

U.S. PATENT DOCUMENTS

| | | | | |
|---|---|---|---|---|
| 2002/0167282 | A1* | 11/2002 | Kirkpatrick | H01J 61/52 315/248 |
| 2006/0057997 | A1* | 3/2006 | Hausdorf | G01R 19/04 455/264 |
| 2007/0194775 | A1* | 8/2007 | Ahn | G01N 15/0266 324/71.4 |
| 2008/0091350 | A1* | 4/2008 | Smith | G01C 21/165 701/472 |

FOREIGN PATENT DOCUMENTS

| | | |
|---|---|---|
| CN | 102375007 A | 3/2012 |
| CN | 107203803 A | 9/2017 |

* cited by examiner

CHARGED PARTICLE COUNTING DEVICE, MANUFACTURING METHOD THEREOF, AND CHARGED PARTICLE COUNTING SYSTEM

This application is a 371 of PCT Patent Application Serial No. PCT/CN2018/083828, filed on Apr. 20, 2018, which claims priority to the Chinese Patent Application No. 201710399348.6, filed on May 31, 2018 and titled "CHARGED PARTICLE COUNTING DEVICE, MANUFACTURING METHOD THEREOF", the disclosure of which are incorporated herein by reference in its entirety.

TECHNICAL FIELD

The present disclosure relates to a charged particle counting device, a manufacturing method thereof, and a charged particle counting system.

BACKGROUND

In many physical or chemical experiments, it is often desired to count charged particles. For example, in chemical experiments, it is necessary to count anions (negatively charged particles) or cations (positively charged particles) in solution in order to calculate the concentration of the solution. As another example, in physical experiments, it is necessary to detect the number of charged particles in vacuum in order to study the properties of the charged particles.

SUMMARY

The present disclosure provides a charged particle counting device, a manufacturing method thereof, and a charged particle counting system.

In an aspect, there is provided a charged particle counting device, comprising:

a bipolar transistor and a magneto-electric induction coil, wherein a gate of the bipolar transistor is electrically connected with and end of the magneto-electric induction coil, and the other end of the magneto-electric induction coil is applied with a constant voltage, when a stream of positively charged particles passes through the magneto-electric induction coil and a first induced voltage generated by the magneto-electric induction coil is greater than a predetermined voltage threshold, a channel of the bipolar transistor is an N-type channel and the N-type channel is in an open state; and when a stream of negatively charged particles passes through the magneto-electric induction coil and a second induced voltage generated by the magneto-electric induction coil is less than the predetermined voltage threshold, the channel of the bipolar transistor is a P-type channel and the P-type channel is in the open state.

Optionally, the device further comprises: an analog-digital converter, wherein a first pole of the bipolar transistor is electrically connected with the analog-digital converter and a second pole of the bipolar transistor is used to apply a supply voltage, and the first and second poles are one of a source electrode and a drain electrode, respectively.

Optionally, the other end of the magneto-electric induction coil is grounded.

Optionally, the bipolar transistor is a carbon nanotube transistor, comprising:

a base substrate, and a gate pattern, an insulating layer, a carbon nanotube film pattern, an electron blocking layer, a source-drain electrode metal pattern, a protection layer and an electrode layer which are successively disposed on the base substrate, wherein the source-drain electrode metal pattern comprises: the source electrode and the drain electrode.

Optionally, the electrode layer is prepared from indium tin oxide.

Optionally, the source-drain electrode metal pattern is a copper metal pattern having a thickness of 300 nanometers.

Optionally, the protection layer is an alumina layer having a thickness of 100 nanometers.

Optionally, the base substrate is one of a glass substrate, a silicon substrate and a flexible polyimide substrate.

In another aspect, there is provided a manufacturing method of a charged particle counting device, wherein the method comprises:

forming a bipolar transistor;

electrically connecting a gate electrode of the bipolar transistor with and end of a magneto-electric induction coil; and applying a constant voltage to the other end of the magneto-electric induction coil.

Optionally, the method further comprises:

electrically connecting a first pole of the bipolar transistor with an analog-digital converter; and applying a supply voltage to a second pole of the bipolar transistor, and the first and second poles being one of a source electrode and a drain electrode, respectively.

Optionally, the bipolar transistor is a carbon nanotube transistor, and the forming a bipolar transistor comprises:

forming a gate pattern on a base substrate;

forming an insulating layer on the base substrate formed with the gate pattern;

forming a carbon nanotube film pattern on the base substrate formed with the insulating layer;

forming an electron blocking layer on the base substrate formed with the carbon nanotube film pattern;

forming a source-drain electrode metal pattern on the base substrate formed with the electron blocking layer, the source-drain electrode metal pattern comprising: a source electrode and a drain electrode;

forming a protection layer on the base substrate formed with the source-drain electrode metal pattern; and forming an electrode layer on the base substrate formed with the protection layer.

Optionally, the forming an electrode layer on the base substrate formed with the protection layer, comprises:

forming the electrode layer on the base substrate formed with the protection layer by way of depositing indium tin oxide.

Optionally, the applying a constant voltage at the other end of the magneto-electric induction coil, comprises:

grounding the other end of the magneto-electric induction coil.

Optionally, the forming a carbon nanotube film pattern on the base substrate formed with the insulating layer, comprising:

forming a carbon nanotube film layer on the insulating layer in the Czochralski method; and performing one-time patterning process on the carbon nanotube film layer to form the carbon nanotube film pattern.

Optionally, the source-drain electrode metal pattern is a copper metal pattern having a thickness of 300 nanometers.

Optionally, forming a protection layer on the base substrate formed with the source-drain electrode metal pattern comprises:

forming the protection layer on the base substrate formed with the source-drain electrode metal pattern by way of atomic layer deposition.

Optionally, the protection layer is an alumina layer having a thickness of 100 nanometers.

Optionally, the base substrate is one of a glass substrate, a silicon substrate and a flexible polyimide substrate.

In yet another aspect, there is provided a charged particle counting system, wherein the system comprises any one of the charged particle counting devices as described above.

Optionally, the system comprises a vacuum chamber which is configured to accommodate charged particles and in which the charged particle counting device is disposed; or the system comprises a container which is configured to contain a solution of the charged particles and in which the charged particle counting device is disposed.

DETAILED DESCRIPTION

The embodiments of the present disclosure will be described in detail below with reference to the accompanying drawings, in order to clearly present the principles, and advantages of the present disclosure.

In many physical or chemical experiments, it is often desired to count charged particles. For example, in chemical experiments, it is necessary to count anions (negatively charged particles) or cations (positively charged particles) in solution in order to calculate the concentration of the solution. As another example, in physical experiments, it is necessary to detect the number of charged particles in vacuum in order to study the properties of the charged particles.

In the related art, the charged particle counting device typically comprises: a magneto-electric induction coil, a field effect transistor and an analog-digital converter. The field effect transistor is electrically connected with the magneto-electric induction coil, in which the field effect transistor is an N-type field effect transistor or a P-type field effect transistor. Taking detection of the number of charged particles in the vacuum as an example, the counting may be performed by using the magneto-electric induction coil connected with the P-type field effect transistor, when the particles in the vacuum are negatively charged. The counting method comprises: calculating, by the analog-digital converter, the number of the negatively charged particles, based on the monitored current in the P-type field effect transistor, when the charged particles pass through the magneto-electric induction coil. And the counting may be performed by using the magneto-electric induction coil connected with the N-type field effect transistor, when the charged particles in the vacuum are positively charged. The counting method comprises: calculating, by the analog-digital converter, the number of the positively charged particles based on the monitored current in the N-type field effect transistor, when the charged particles pass through the magneto-electric induction coil. The charged particle counting device in the related art can only count the positively charged particles or negatively charged particles and thus has a relatively simple function.

Figure 1:
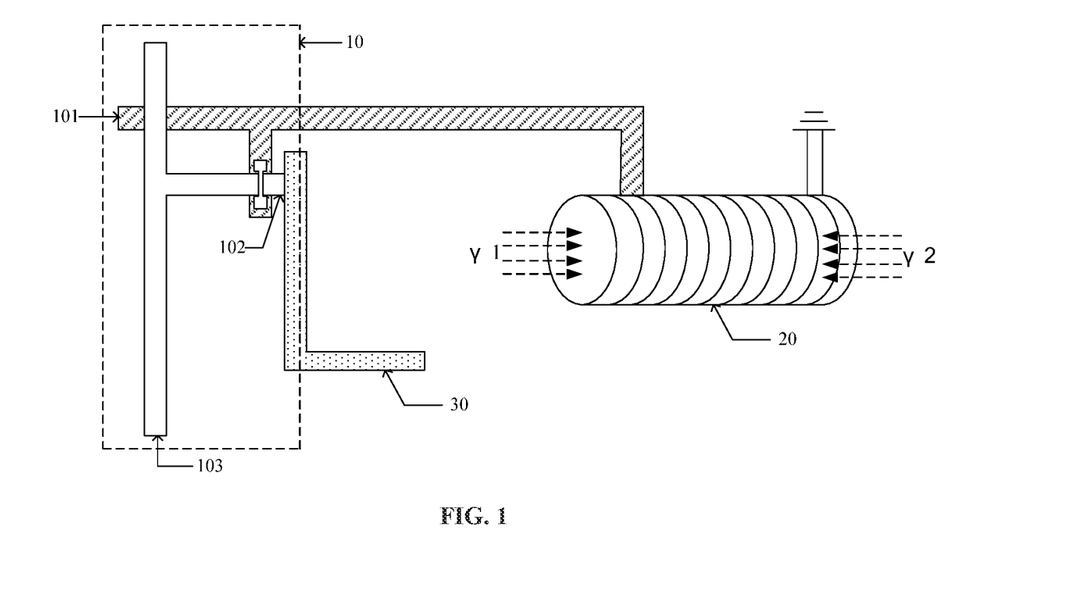
FIG. 1 is a schematic diagram of a structure of a charged particle counting device provided in an embodiment of the present disclosure.

The embodiments of the present disclosure provide a charged particle counting device, which can solve the problems in the related art. As shown in FIG. 1, the device comprises:

a bipolar transistor 10, a magneto-electric induction coil 20 and an analog-digital converter 30.

Herein, a gate 101 of the bipolar transistor 10 is electrically connected with and end of the magneto-electric induction coil 20, and the other end of the magneto-electric induction coil 20 is applied with a constant voltage. A first pole 102 of the bipolar transistor 10 is electrically connected with the analog-digital converter 30, and a second pole 103 of the bipolar transistor 10 is configured to apply a supply voltage. The first and second poles are one of a source electrode and a drain electrode, respectively. That is to say, the first pole is the source electrode and the second pole is the drain electrode. Alternatively, the first pole is the drain electrode and the second pole is the source electrode.

In the embodiments of the present disclosure, the first pole being the drain electrode and the second pole being the source electrode are described as an example.

In practical application, the other end of the magneto-electric induction coil 20 may be grounded, i.e., an applied voltage at the other end of the magneto-electric induction coil 20 is 0.

When a stream of positively charged particles γ1 passes through the magneto-electric induction coil 20 and a first induced voltage generated by the magneto-electric induction coil is greater than a predetermined voltage threshold, a channel of the bipolar transistor is an N-type channel and the N-type channel is in an open state. When a stream of negatively charged particles γ2 passes through the magneto-electric induction coil 20 and a second induced voltage generated by the magneto-electric induction coil is less than the predetermined voltage threshold, the channel of the bipolar transistor is a P-type channel and the P-type channel is in the open state. Herein, the arrows of the charged particle stream γ1 and the charged particle stream γ2 in FIG. 1 indicate current directions in the channels of the magneto-electric induction coil.

In summary, for the charged particle counting device provided in the embodiments of the present disclosure, when the first induced voltage generated by the magneto-electric induction coil is greater than the predetermined voltage threshold, i.e., when the voltage applied to the gate of the bipolar transistor is greater than the predetermined voltage threshold, a channel of the bipolar transistor is an N-type channel, and may be used to count the positively charged particles. And when the second induced voltage generated by the magneto-electric induction coil is less than the predetermined voltage threshold, i.e., when the voltage applied to the gate of the bipolar transistor is less than the predetermined voltage threshold, the channel of the bipolar transistor is a P-type channel, and may be used to count the negatively charged particles. Therefore, the charged particle counting device may be not only configured to count the positively charged particles, but also configured to count the negatively charged particles, and thus enriches the functions of the charged particle counting device.

It should be noted that the bipolar transistor is a transistor whose channel can have characteristics of the N-type channel and the P-type channel under different conditions, respectively. For example, the bipolar transistor may be a carbon nanotube transistor, and the intrinsic carriers of the carbon nanotube are electrons, in the embodiments of the present disclosure. Theoretically, when the carbon nanotube is used as a channel material of a thin film transistor (TFT), the carbon nanotube transistor (a film transistor (TFT) using a carbon nanotube as a channel material is referred to as a carbon nanotube transistor) should be an N-type transistor. However, since the surface of the carbon nanotube easily adsorbs water-oxygen holes in the air (e.g., groups such as a hydroxyl group, an epoxy group or the like), in fact, the carbon nanotube transistor is a P-type transistor when unencapsulated. After the carbon nanotube transistor is encapsulated with an encapsulation material, the encapsulation material isolates the water-oxygen holes in the air, and balances the hole carriers and the electron carriers in the carbon nanotube. Therefore, the carbon nanotube transistor can exhibit a bipolarity. That is, the channel of the carbon nanotube transistor may be the N-type channel, or the channel of the carbon nanotube transistor may be the P-type channel under certain conditions.

Figure 2:
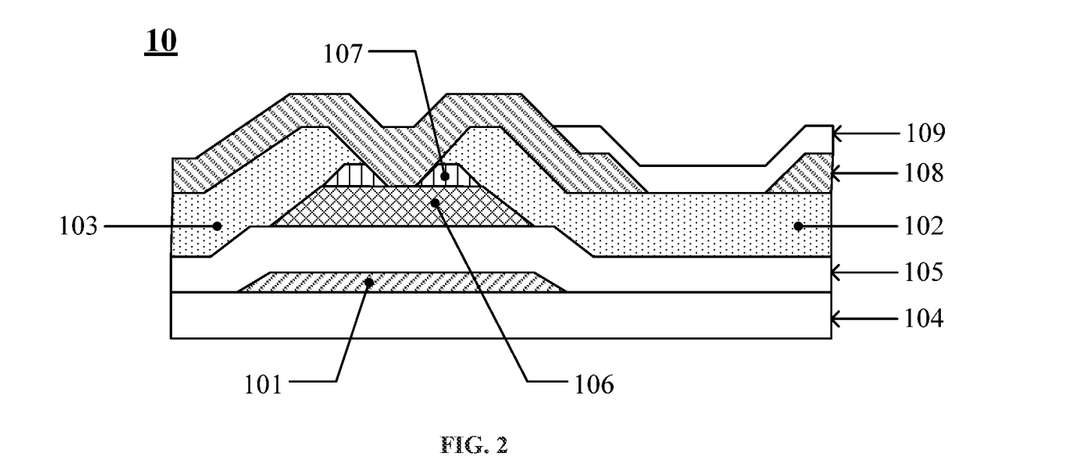
FIG. 2 is a schematic diagram of a structure of a carbon nanotube transistor provided in an embodiment of the present disclosure.

Optionally, in the embodiments of the present disclosure, an encapsulation structure comprises: a base substrate and a protection layer. For example, a structure of the carbon nanotube transistor 10 may be as shown in FIG. 2, and the carbon nanotube transistor 10 may comprise:

a base substrate 104, on which a gate pattern 101, an insulating layer 105, a carbon nanotube film pattern 106, an electronic blocking layer 107, a source-drain electrode metal pattern, a protection layer 108 and an electrode layer 109 are successively disposed, herein, the source-drain electrode metal pattern may comprise: a source electrode 103 and a drain electrode 102.

Optionally, the electrode layer may be prepared from indium tin oxide.

Herein, the source-drain electrode metal pattern may be a copper metal pattern having a thickness of 300 nanometers. Since copper is a metal of which a work function is relatively closer to that of the carbon nanotube in common non-noble metals, and the work function of the carbon nanotube is 4.4 electron volts (simply referred to as eV) and the work function of the copper is 4.65 eV, when a copper metal pattern comes into contact with a carbon nanotube film pattern, a difference in work function between the copper metal pattern and the carbon nanotube film pattern is relatively small, and thus a contact surface potential barrier of the copper metal pattern and the carbon nanotube film pattern can be reduced and an Ohmic contact is easily formed. That is to say, the losses in an electron transport process can be minimized, and the sensitivity of the carbon nanotube transistor can be improved.

Optionally, the protection layer may be an alumina layer having a thickness of 100 nanometers. Since the alumina layer has high compactness and can effectively isolate the water oxygen in the air, the bipolar characteristics of the carbon nanotube transistor are ensured. The materials of the protection layer may also be silicon oxide and/or silicon nitride, which will not be limited in the embodiments of the disclosure.

Optionally, the base substrate may be a glass substrate, or a silicon wafer (i.e., a silicon substrate) or a flexible polyimide (PI for short) substrate, which will not be limited in the embodiments of the disclosure.

Figure 3:
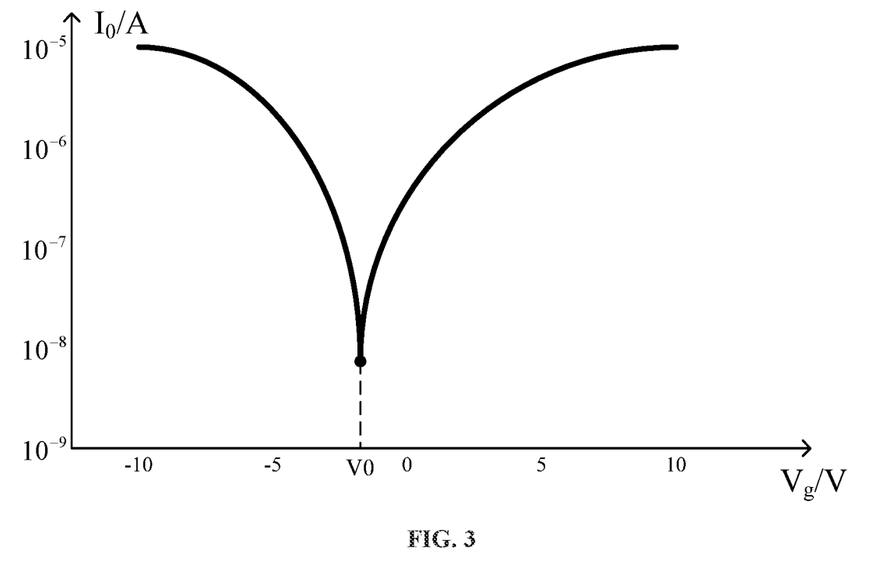
FIG. 3 is a schematic diagram of dual-switch characteristics of a carbon nanotube transistor provided in an embodiment of the present disclosure.

FIG. 3 shows a schematic diagram of dual-switch characteristics of the carbon nanotube transistor provided in the embodiments of the present disclosure, in which the abscissa represents the magnitude of the gate voltage Vg and the unit is volts (simply referred to as V), and the ordinate represents the magnitude of the drain current I0 in Amperes (simply referred to as A), where a predetermined voltage threshold is V0 and a supply voltage applied to a source electrode may be −5.1V. In practical application, the supply voltage applied to the source electrode may be determined based on an output power of the carbon nanotube transistor. The magnitude of the supply voltage applied to the source electrode is not limited in the embodiments of the disclosure.

Figure 4:
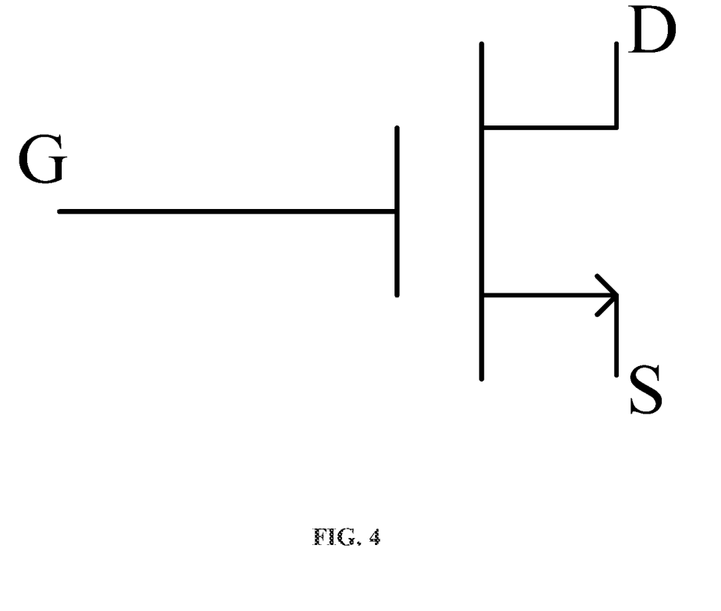
FIG. 4 is a schematic diagram of a circuit of a carbon nanotube transistor provided in an embodiment of the present disclosure.
Figure 5:
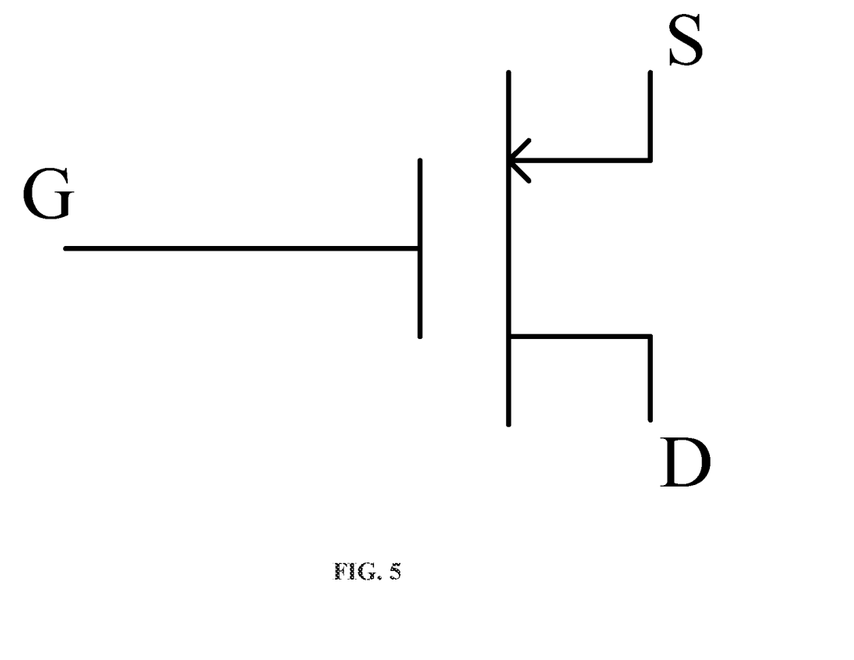
FIG. 5 is a schematic diagram of a circuit of another carbon nanotube transistor provided in an embodiment of the present disclosure.

As shown in FIG. 3, during the magnitude of the gate voltage Vg changes from 10V to −10V, when the first induced voltage generated by the magneto-electric induction coil is greater than the predetermined voltage threshold, i.e., Vg is greater than V0, the channel of the carbon nanotube transistor is the N-type channel. The circuit diagram of the carbon nanotube transistor can be refer to FIG. 4, where G is a gate, D is a drain, and S is a source. The drain current I0 also increases as the gate voltage Vg increases. When Vg is less than V0, the channel of the carbon nanotube transistor is the P-type channel. The circuit diagram of the carbon nanotube transistor can be refer to FIG. 5, where G is a gate, D is a drain, and S is a source. The drain current I0 increases as the gate voltage Vg decreases. It can be seen from FIG. 3 that the value of the predetermined voltage threshold V0 may be a negative value, a compensation voltage may be applied to the gate in practical application, and the predetermined voltage threshold is set to 0.

For example, the charged particle counting device provided in the embodiments of the present disclosure can count the charged particles in vacuum or in solution. In a case where the predetermined voltage threshold is assumed to be 0, the charged particles in solution being counted are exemplarily illustrated. A counting process may be described as follows.

The magneto-electric induction coil is placed into a to-be-measured solution having unknown electrical properties. The charged particles pass through a channel of the magneto-electric induction coil that can generate an induced voltage. Since anAnd end of the magneto-electric induction coil is electrically connected with the gate of the carbon nanotube transistor, the other end is grounded, and the magneto-electric induction coil generates the induced voltage according to a motion of the charged particles, the gate voltage of the carbon nanotube transistor is equal to the induced voltage. When most of the particles in solution are positively charged, since the induced voltage generated by the magneto-electric induction coil is positive when the positively charged particles pass through the channel of the magneto-electric induction coil, the channel of the carbon nanotube transistor is the N-type channel. The drain current also increases as the induced voltage increases. The analog-digital converter electrically connected with the drain of the carbon nanotube transistor may calculate the number of the positively charged particles in solution according to the drain current. Similarly, when most of the particles in solution are negatively charged, since the induced voltage generated by the magneto-electric induction coil is negative when the negatively charged particles pass through the channel of the magneto-electric induction coil, the channel of the carbon nanotube transistor is the P-type channel. The drain current increases as induced voltage decreases. The analog-digital converter electrically connected with the drain electrode of the carbon nanotube transistor may calculate the number of the negatively charged particles in solution according to the drain current. Therefore, the charged particle counting device provided in the embodiments of the present disclosure may be not only configured to count the positively charged particles, but also configured to count the negatively charged particles, and thus realizes a function of measuring charged particles having a plurality of electrical properties using a single device.

It should be noted that the charged particle counting device provided in the embodiments of the present disclosure may be also used for other charging testing, e.g., for testing the movement of groups of positive and negative ions in a battery electrolyte solution.

In addition, since the carbon nanotube transistor has bipolar characteristics, dual-switch characteristics may be realized in a single device thereby the preparation process for the device that needs to have the dual-switch characteristics can greatly be simplified. In addition, The standby power consumption of the device can be reduced by setting a carbon nanotube transistor instead of simultaneously providing an N-type transistor and a P-type transistor in the device. The carbon nanotube transistor is also applicable to a plurality of feedback circuits such as temperature control, voltage control or the like, and the details will be not repeated in the embodiments of the disclosure.

In summary, for the charged particle counting device provided in the embodiments of the present disclosure, when the first induced voltage generated by the magneto-electric induction coil is greater than the predetermined voltage threshold, i.e., when the voltage applied to the gate of the bipolar transistor is greater than the predetermined voltage threshold, the channel of the bipolar transistor is an N-type channel, and can be used to count the positively charged particles. And when the second induced voltage generated by the magneto-electric induction coil is less than the predetermined voltage threshold, i.e., when the voltage applied to the gate of the bipolar transistor is less than the predetermined voltage threshold, the channel of the bipolar transistor is a P-type channel, and can be used to count the negatively charged particles. Therefore, the charged particle counting device may be not only configured to count the positively charged particles, but also configured to count the negatively charged particles, and thus enriches the functions of the charged particle counting device.

Figure 6:
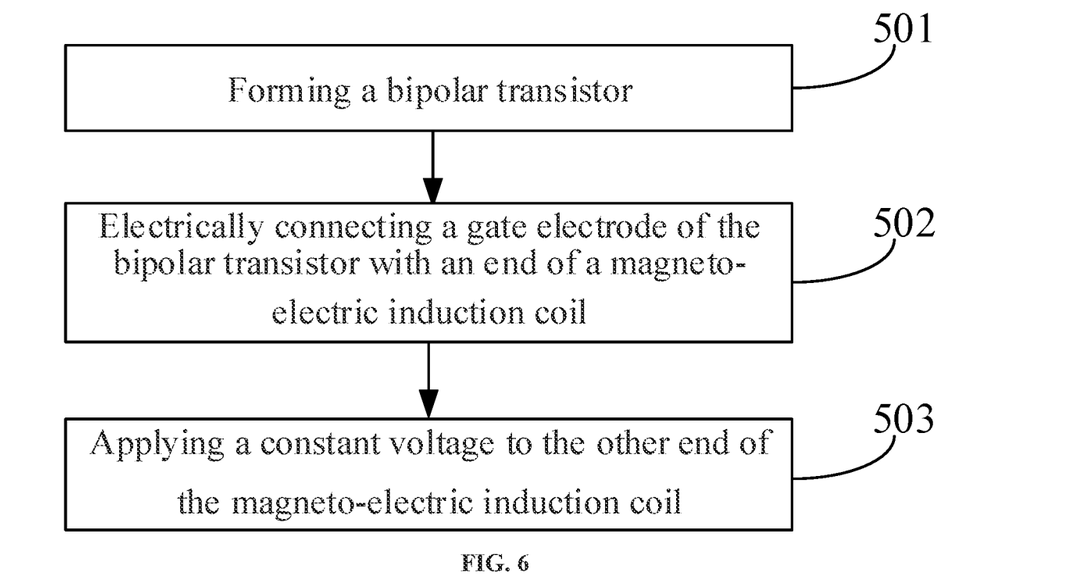
FIG. 6 is a flowchart of a manufacturing method of a charged particle counting device provided in an embodiment of the present disclosure.

There provides a manufacturing method of a charged particle counting device in an embodiment of the present disclosure. As shown in FIG. 6, the method may include the following operation processes:

in step 501, a bipolar transistor is formed;

in step 502, a gate electrode of the bipolar transistor is electrically connected with an end of a magneto-electric induction coil; and in step 503, a constant voltage is applied to the other end of the magneto-electric induction coil.

Optionally, the other end of the magneto-electric induction coil may be grounded.

In summary, according to the manufacturing method of a charged particle counting device provided in the embodiments of the present disclosure, a gate electrode of the bipolar transistor is electrically connected with an end of a magneto-electric induction coil. When the first induced voltage generated by the magneto-electric induction coil is greater than the predetermined voltage threshold, i.e., when the voltage applied to the gate of the bipolar transistor is greater than the predetermined voltage threshold, the channel of the bipolar transistor is an N-type channel, and may be used to count the positively charged particles. And when the second induced voltage generated by the magneto-electric induction coil is less than the predetermined voltage threshold, i.e., when the voltage applied to the gate of the bipolar transistor is less than the predetermined voltage threshold, the channel of the bipolar transistor is a P-type channel, and may be used to count the negatively charged particles. Therefore, the charged particle counting device may be not only configured to count the positively charged particles, but also configured to count the negatively charged particles, and thus enriches the functions of the charged particle counting device.

Optionally, the method further includes: electrically connecting a first pole of the bipolar transistor to an analog-digital converter; and applying a supply voltage to a second pole of the bipolar transistor, and the first and second poles being one of a source electrode and a drain electrode, respectively.

In the embodiments of the present disclosure, the first pole being the drain electrode and the second pole being the source electrode are exemplarily illustrated. The magnitude of the supply voltage applied to the source electrode may be −5.1V. The magnitude of the supply voltage applied to the source electrode depends on the output power of the bipolar transistor, and thus will not be limited in the embodiments of the disclosure.

Optionally, the gate of the bipolar transistor may be connected with an end of the magneto-electric induction coil in a bonding manner.

Optionally, the bipolar transistor may be a carbon nanotube transistor. Accordingly, a process of forming the carbon nanotube transistor may comprise:

forming a gate pattern on the base substrate; forming an insulating layer on the base substrate formed with the gate pattern; forming a carbon nanotube film pattern on the base substrate formed with the insulating layer; forming an electron blocking layer on the base substrate formed with the carbon nanotube film pattern; forming a source-drain electrode metal pattern on the base substrate formed with the electron blocking layer, the source-drain electrode metal pattern including a source electrode and a drain electrode; forming a protection layer on the base substrate formed with the source-drain electrode metal pattern; and forming an electrode layer on the base substrate formed with the protection layer.

Optionally, the source-drain electrode metal pattern may be a copper metal pattern having a thickness of 300 nanometers. Since copper is a metal of which a work function is relatively closer to that of the carbon nanotube in common non-noble metals, and the work function of the carbon nanotube is 4.4 eV and the work function of the copper is 4.65 eV, when a copper metal pattern comes into contact with a carbon nanotube film pattern, a difference in work function between the copper metal pattern and the carbon nanotube film pattern is relatively small, and thus a contact surface potential barrier of the copper metal pattern and the carbon nanotube film pattern can be reduced and an Ohmic contact is easily formed. That is to say, the losses in an electron transport process can be minimized, and the sensitivity of the carbon nanotube transistor can be improved.

Optionally, the protection layer may be an alumina layer having a thickness of 100 nanometers. Since the alumina layer has high compactness and can effectively isolate the water oxygen in the air, the bipolar characteristics of the carbon nanotube transistor are ensured. The materials of the protection layer may also be silicon oxide and/or silicon nitride, which will not be limited in the embodiments of the disclosure.

Optionally, the base substrate may be a glass substrate, or a silicon substrate or a PI substrate, which will not be limited in the embodiments of the disclosure.

For example, refer to FIG. 2 for the structure of the carbon nanotube transistor. A specific forming process may comprise:

S1: cleaning the base substrate 104 in a standard mode; forming a gate layer having a thickness of 220 nanometers on the base substrate 104 by adopting a method of sputtering metallic molybdenum; and forming the gate pattern 101 via a patterning process.

Herein, one-time patterning process may include: photoresist coating, exposure, development, etching and photoresist stripping.

S2: depositing a mixture of silicon oxide and silicon nitride on the base substrate 104 formed with the gate pattern 101 by using a Plasma Enhanced Chemical Vapor Deposition (simply referred to as PECVD) method; forming the insulating layer 105 having a thickness of 100 nanometers, and forming a contact hole connected with the gate pattern 101 on the insulating layer 105 by dry etching.

S3: forming a carbon nanotube film layer having a thickness of 15 nanometers on the insulating layer 105 by the Czochralski method; performing one-time patterning process on the carbon nanotube film layer; and forming the carbon nanotube film pattern 106.

Herein, the one-time patterning process may include: the photoresist coating, the exposure, the development, the etching and the photoresist stripping.

S4: sputter depositing molybdenum oxide on the carbon nanotube film pattern 106; and forming an electron blocking layer 107 by the patterning process.

S5: sputter depositing a copper metal layer having a thickness of 300 nanometers on the base substrate 104 formed with the electron blocking layer 107; and forming the source-drain electrode metal pattern including the source electrode 103 and the drain electrode 102 by the patterning process.

S6: depositing the alumina in the source-drain electrode metal pattern by a manner of atomic layer deposition; and forming the protection layer 108 having a thickness of 100 nanometers.

S7: forming the electrode layer 109 on the protection layer 108 by way of depositing indium tin oxide.

It should be noted that the sequence of the steps of the manufacturing method of the charged particle counting device provided in the embodiments of the present disclosure may be adjusted appropriately and the steps may also be accordingly increased and decreased according to the circumstances. Varied methods which may easily occur to those skilled in the art in the technical scope disclosed by the present disclosure should fall within the extent of protection of the present disclosure, and thus the details will be not repeated herein.

In summary, according to the manufacturing method of a charged particle counting device provided in the embodiments of the present disclosure, a gate electrode of the bipolar transistor is electrically connected with an end of a magneto-electric induction coil, and the source or the drain of the bipolar transistor is connected to the analog-digital converter. When the first induced voltage generated by the magneto-electric induction coil is greater than the predetermined voltage threshold, i.e., when the voltage applied to the gate of the bipolar transistor is greater than the predetermined voltage threshold, the channel of the bipolar transistor is an N-type channel, and may be used to count the positively charged particles. And when the second induced voltage generated by the magneto-electric induction coil is less than the predetermined voltage threshold, i.e., when the voltage applied to the gate of the bipolar transistor is less than the predetermined voltage threshold, the channel of the bipolar transistor is a P-type channel, and may be used to count the negatively charged particles. Therefore, this charged particle counting device can be not only configured to count the positively charged particles, but also configured to count the negatively charged particles, and thus enriches the functions of the charged particle counting device.

It can be clearly understood by those skilled in the art that for the convenience and conciseness of description, the structures involved in the above method embodiments may be made reference to the foregoing structure side embodiments, which are not repeated herein.

The foregoing descriptions are only optional embodiments of the present disclosure, and are not intended to limit the scope of the present disclosure. Within the spirit and principles of the disclosure, any modifications, equivalent substitutions, improvements, etc., should be included in the protection scope of appended claims of the present disclosure.

What is claimed is:

1. A charged particle counting device, comprising:
a bipolar transistor and a magneto-electric induction coil, wherein a gate of the bipolar transistor is electrically connected to an end of the magneto-electric induction coil, and the other end of the magneto-electric induction coil is applied with a constant voltage,
when a stream of positively charged particles passes through the magneto-electric induction coil, and a first induced voltage generated by the magneto-electric induction coil is greater than a predetermined voltage threshold, a channel of the bipolar transistor is an N-type channel and the N-type channel is in an open state; and when a stream of negatively charged particles passes through the magneto-electric induction coil, and a second induced voltage generated by the magneto-electric induction coil is less than the predetermined voltage threshold, the channel of the bipolar transistor is a P-type channel and the P-type channel is in the open state.

2. The device according to claim 1, wherein the device further comprises: an analog-digital converter, a first pole of the bipolar transistor is electrically connected with the analog-digital converter and a second pole of the bipolar transistor is used to apply a supply voltage, and the first and second poles are one of a source electrode and a drain electrode, respectively.

3. The device according to claim 1, wherein the other end of the magneto-electric induction coil is grounded.

4. The device according to claim 1, wherein the bipolar transistor is a carbon nanotube transistor comprising:
a base substrate, and a gate pattern, an insulating layer, a carbon nanotube film pattern, an electron blocking layer, a source-drain electrode metal pattern, a protection layer and an electrode layer which are successively disposed on the base substrate, the source-drain electrode metal pattern comprising the source electrode and the drain electrode.

5. The device according to claim 4, wherein the electrode layer is prepared from indium tin oxide.

6. The device according to claim 4, wherein the source-drain electrode metal pattern is a copper metal pattern having a thickness of 300 nanometers.

7. The device according to claim 4, wherein the protection layer is an alumina layer having a thickness of 100 nanometers.

8. The device according to claim 4, wherein the base substrate is one of a glass substrate, a silicon substrate and a flexible polyimide substrate.

9. A charged particle counting system, comprising the charged particle counting device according to claim 1.

10. The system according to claim 9, further comprising one of a vacuum chamber which is configured to accommodate charged particles and in which the charged particle counting device is disposed and a container which is configured to contain a solution of the charged particles and in which the charged particle counting device is disposed.

11. A manufacturing method of a charged particle counting device, comprising:
    forming a bipolar transistor;
    electrically connecting a gate electrode of the bipolar transistor with an end of a magneto-electric induction coil; and
    applying a constant voltage to the other end of the magneto-electric induction coil.

12. The method according to claim 11, wherein the method further comprises:
    electrically connecting a first pole of the bipolar transistor with an analog-digital converter; and
    applying a supply voltage to a second pole of the bipolar transistor, and the first and second poles being one of a source electrode and a drain electrode, respectively.

13. The method according to claim 12, wherein the bipolar transistor is a carbon nanotube transistor, and the forming a bipolar transistor comprises:
    forming a gate pattern on a base substrate;
    forming an insulating layer on the base substrate formed with the gate pattern;
    forming a carbon nanotube film pattern on the base substrate formed with the insulating layer;
    forming an electron blocking layer on the base substrate formed with the carbon nanotube film pattern;
    forming a source-drain electrode metal pattern on the base substrate formed with the electron blocking layer, the source-drain electrode metal pattern comprising a source electrode and a drain electrode;
    forming a protection layer on the base substrate formed with the source-drain electrode metal pattern; and
    forming an electrode layer on the base substrate formed with the protection layer.

14. The method according to claim 13, wherein the forming an electrode layer on the base substrate formed with the protection layer comprises:
    forming the electrode layer on the base substrate formed with the protection layer by way of depositing indium tin oxide.

15. The method according to claim 13, wherein the forming a carbon nanotube film pattern on the base substrate formed with the insulating layer, comprises:
    forming a carbon nanotube film layer on the insulating layer by a Czochralski method; and
    performing one-time patterning process on the carbon nanotube film layer to form the carbon nanotube film pattern.

16. The method according to claim 13, wherein the source-drain electrode metal pattern is a copper metal pattern having a thickness of 300 nanometers.

17. The method according to claim 13, wherein forming a protection layer on the base substrate formed with the source-drain electrode metal pattern comprises:
    forming the protection layer on the base substrate formed with the source-drain electrode metal pattern by way of atomic layer deposition.

18. The method according to claim 13, wherein the protection layer is an alumina layer having a thickness of 100 nanometers.

19. The method according to claim 13, wherein the base substrate is one of a glass substrate, a silicon substrate and a flexible polyimide substrate.

20. The method according to claim 11, wherein the applying a constant voltage to the other end of the magneto-electric induction coil comprises:
    grounding the other end of the magneto-electric induction coil.

* * * * *